United States Patent [19]

Besserer et al.

[11] Patent Number: 5,584,406
[45] Date of Patent: *Dec. 17, 1996

[54] RACK FRAME

[75] Inventors: Horst Besserer, Herborn; Klaus-Dieter Bovermann, Breidenbach-Nieder-dieten; Marc Hartel, Reiskirchen, all of Germany

[73] Assignee: Rittal-Werk Rudolf Loh GmbH & Co. KG, Germany

[*] Notice: The term of this patent shall not extend beyond the expiration date of Pat. No. 5,513,759.

[21] Appl. No.: 310,240

[22] Filed: Sep. 21, 1994

[30] Foreign Application Priority Data

Sep. 28, 1993 [DE] Germany .......................... 43 33 025.8

[51] Int. Cl.⁶ ................................................. A47B 57/00
[52] U.S. Cl. .......................... 211/189; 211/26; 211/191; 312/140; 312/265.2
[58] Field of Search .................... 211/189, 26, 191; 312/140, 265.1, 265.2, 265.4, 265.5, 265.3

[56] References Cited

U.S. PATENT DOCUMENTS

| | | | |
|---|---|---|---|
| 3,297,383 | 1/1967 | Fay | 312/265.4 |
| 3,347,610 | 10/1967 | Pilliod | 312/140 |
| 4,154,493 | 5/1979 | Prater | 312/265.5 |
| 4,221,443 | 9/1980 | Heaney | 312/140 |
| 4,643,319 | 2/1987 | DeBus et al. | 211/189 |
| 4,958,259 | 9/1990 | Berg et al. | 312/265.2 |
| 4,988,008 | 1/1991 | Blum et al. | 211/26 |
| 5,267,658 | 12/1993 | Schwenk et al. | 211/26 |
| 5,372,262 | 12/1994 | Benson et al. | 211/26 |

FOREIGN PATENT DOCUMENTS

| | | |
|---|---|---|
| 2543021 | 9/1975 | Germany . |
| 9102071 | 2/1991 | Germany . |
| 4111403 | 10/1991 | Germany . |
| 9202279 | 2/1992 | Germany . |
| 9209519 | 10/1992 | Germany . |
| 2169791 | 7/1986 | United Kingdom ............ 312/140 |

Primary Examiner—Karen J. Chotkowski
Assistant Examiner—Anita M. King
Attorney, Agent, or Firm—Speckman, Pauley & Fejer

[57] ABSTRACT

A rack frame with vertical supports, which can be partially closed by wall elements, wherein the wall elements are embodied as panel elements with beveled edges and are fastened or can be fastened by fasteners to respectively two adjoining supports. The wall elements can be fastened on the supports of the rack frame in a simple manner at an arbitrary height. The two supports each have a fastening bar extending parallel to the wall element, on which U-shaped fastening elements can be adjusted and fixed in place. The wall elements can be bolted together with the fastening elements, and the edges of the wall elements can be inserted into elongated slots of the supports.

13 Claims, 2 Drawing Sheets

RACK FRAME

BACKGROUND OF THE INVENTION

1. Field of the Invention

This invention relates to a rack frame with vertical supports which can be partially closed by wall elements, wherein the wall elements are embodied as panel elements with beveled edges and fastenable by fastening means to respectively two adjoining supports.

2. Description of Prior Art

With rack frames of this type, the supports are provided with fastening receivers. The wall elements can be connected to the fastening receivers by fastening elbows or, depending on the arrangement of the fastening receivers, they can be bolted directly to the supports. The partial closure of, for example, a lateral wall, by a plurality of wall elements in the form of partial panels is not possible with such a rack frame. To overcome this disadvantage, another known rack frame provides the supports with rows of fastening receivers in the longitudinal direction. In the process, the fastening receivers are preferably disposed at even distances. With such a rack frame, it is possible to fasten partial panels in predetermined positions on the supports.

SUMMARY OF THE INVENTION

It is an object of this invention to provide a rack frame of the type discussed hereinabove, to the vertical supports of which wall elements can be applied rapidly and in a simple way at arbitrary heights.

This and other objects are attained by a rack frame in accordance with one embodiment of this invention comprising at least two adjoining supports each having a fastening bar extending parallel to a wall element, on which U-shaped fastening elements can be adjusted and fixed in place. The wall elements are bolted together or can be bolted together with the fastening elements, and the edges of the wall elements are inserted or can be inserted into elongated slots of the supports.

The fastening elements can be placed on the fastening bar and displaced along it until a desired position has been reached. The fastening element can be fixed in this position and connected to the wall element. It is possible in this way to close off, for example, a lateral wall by a plurality of partial wall elements. This can be of importance in a case where several rack frames are lined up next to each other and connecting lines are strung through the lateral walls from one rack frame to the next rack frame. Furthermore, removable partial wall elements allow a simple and rapid access to defined sectors of the rack frame. This is particularly advantageous for maintenance work.

A wall element fastened to the fastening elements can be arbitrarily displaced along the supports by fastening bars and placed in a desired position. The fastening elements can be locked in this position, so that the wall element is also locked in place. The wall elements can be simply inserted by their edges into the elongated slots and are prepositioned in this way, so that they can be quickly fastened.

In accordance with one embodiment of this invention, a vertical contact bar is disposed on the support which is offset in respect to the outside of the support in the direction toward the interior of the rack frame. The fastening bar is offset in respect to the contact bar in the direction toward the interior of the rack frame and the inside of the wall element is supported on the contact bar.

The fastening elements are disposed behind the wall element and face the interior of the rack frame. As a result, the wall element can be attached from the outside of the rack frame in a simple way. In addition, the fastening element is covered by the wall element so that it does not constitute a visual distraction.

In accordance with another embodiment of this invention, the contact bar is set back in respect to the outside of the support by the thickness of the wall element and the wall element terminates flush with the outside of the support.

In accordance with another embodiment of this invention, the contact bar adjoins the elongated slot of the support. As a result, no slot directed to the outside of the rack frame is created on the support where it adjoins the edge of the wall element.

In accordance with another embodiment of the frame rack of this invention which is sealed against moisture, sealing elements are or can be inserted into the elongated slot of the support. In this case, the front of the edge of the wall element is pressed together with the sealing element in the bottom of the elongated slot. For example, a packing cord of rubber can be used as the sealing element. However, in accordance with another embodiment, a sealing element is attached to the contact bar or the inside of the wall element facing the contact bar.

In accordance with a preferred embodiment of this invention, the fastening bars are undercut and face each other on the front support and the rear support. As a result, two undercuts are formed on which a correspondingly shaped fastening element is maintained and can be continuously adjusted in the longitudinal direction of the elongated slot.

In accordance with yet another embodiment, the fastening element comprises two legs located parallel and at a distance from each other which project beyond the fastening bar on both sides. The leg facing the wall element forms a screw receiver and the leg facing away from the wall element forms a threaded receiver aligned with the screw receiver. A fastening screw is inserted into the screw receiver and screwed into the threaded receiver. The fastening element is embodied as a simple component and can therefore be produced cost-effectively. Depending on the selection of the material, the two legs can be resiliently clamped to the fastening bar and spring back into their initial position when the fastening screw has been removed. Then the fastening element can again be adjusted on the fastening bar.

For simple attachment of the fastening element on the fastening bar, the legs of the fastening element extend parallel to the wall element and are directed toward the front on the front supports and toward the back on the rear supports. In this way, it is also easily possible to insert the fastening screw holding the wall element from the outside of the wall element and to screw it tight.

BRIEF DESCRIPTION OF THE DRAWINGS

This invention will be better understood from the following detailed description taken in conjunction with the drawings, wherein.

DESCRIPTION OF THE PREFERRED EMBODIMENTS

Figure 1:
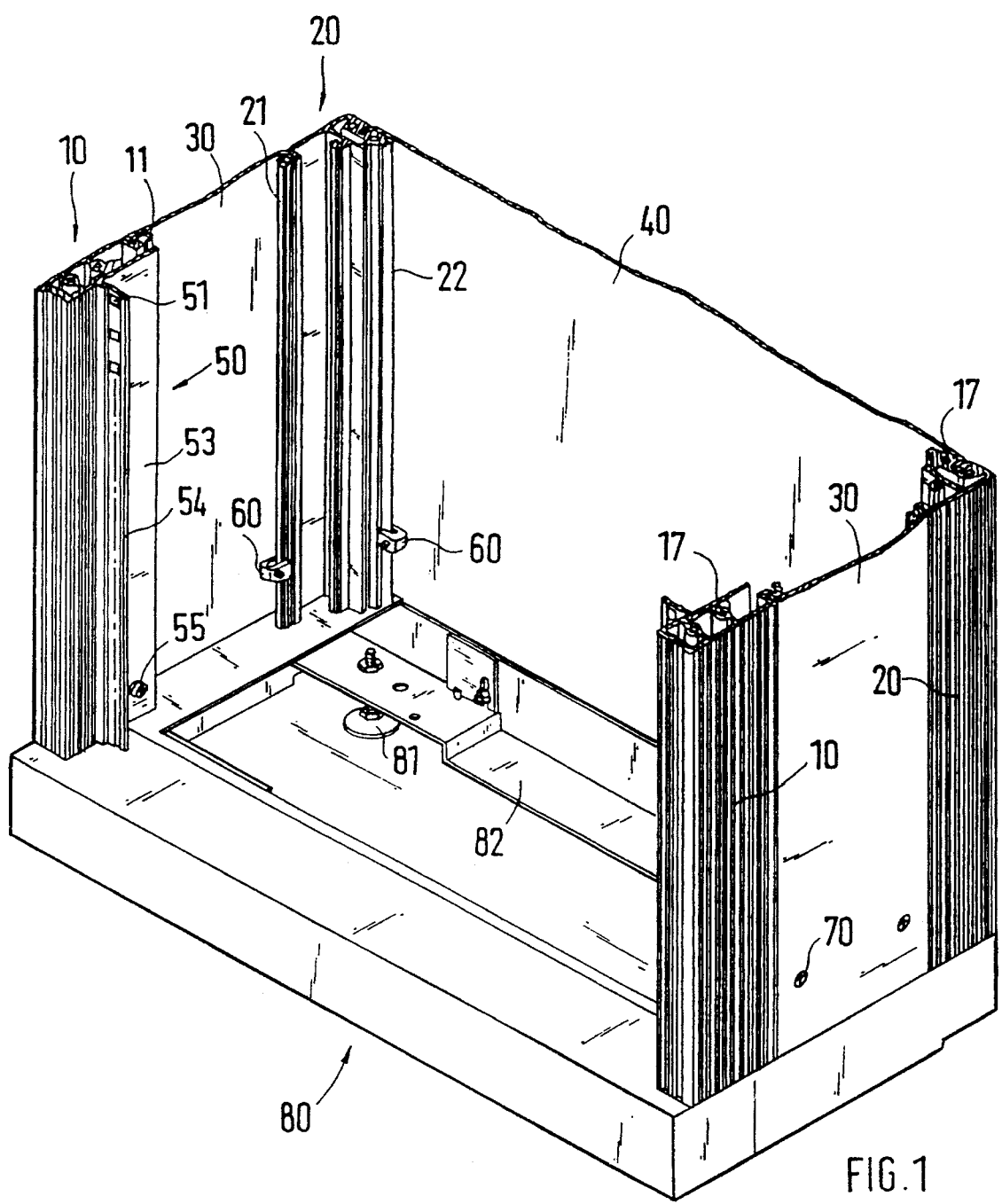
FIG. 1 is a perspective view of a part of a rack frame with a base in accordance with one embodiment of this invention.

A portion of a rack frame in accordance with one preferred embodiment of this invention comprising four vertical supports 10, 20 and a base 80 is shown in FIG. 1. A cross brace 82 which extends horizontally over the width of the rack frame is fastened on the base 80. Bores are formed by the cross brace 82 in the area of the sides of the rack frame into which threaded bolts of the adjustable feet 81 are inserted. The rack frame can, thus, be leveled by the adjustable feet 81.

The base 80 forms fastening receivers into which fastening screws can be inserted from below and screwed into longitudinally oriented screw conduits 17 of the supports 10, 20.

Holders 50, embodied as angled bars, are attached to the two front supports 10. The holders 50 comprise a leg 53 on which a holding projection 54 is formed at right angles. The holding projection 54 forms a plurality of fastening receivers 51. The holders 50 are attached to the insides of the two front supports 10 in such a way that the fastening projections 54 face each other. Fastening on the front supports 10 is achieved by fastening screws 55 which are inserted into elongated holes of the legs 53 and screwed into fastening elements 60 which can be connected to the front supports 10. The fastening element 60 is fastened on a longitudinally oriented fastening bar 11 of the front support 10. Assemblies, for example component supports, can be fastened to the holding projections 54 of the holders 50 by the fastening receivers 51.

Figure 2:
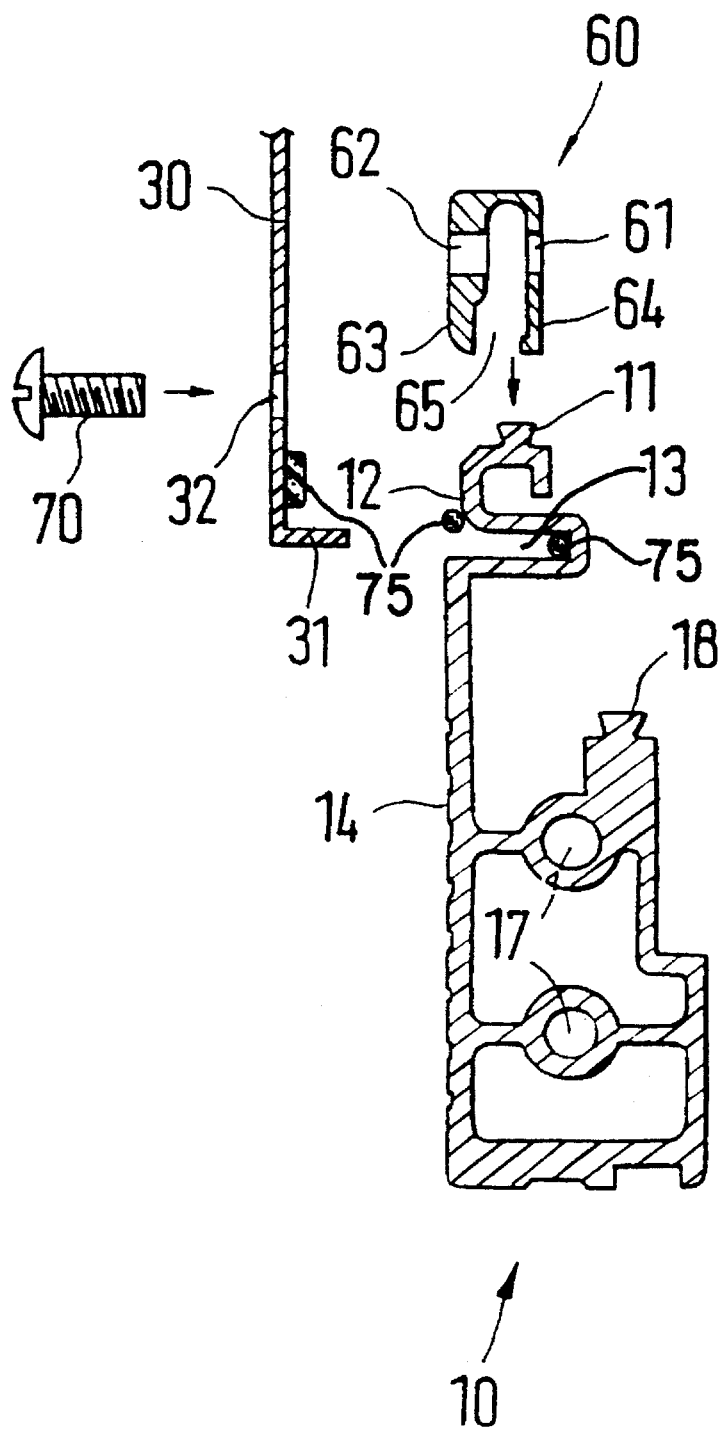
FIG. 2 shows an exploded, cross-sectional top view of a support, a wall and a fastening element for a rack frame in accordance with one embodiment of this invention.

The lateral walls and rear wall of the rack frame are closed by wall elements 30, 40, as shown in more detail in FIG. 1. FIG. 2 shows an exploded view of the front support 10 of FIG. 1, as well as a wall element 30 and a fastening element 60. The front support 10 comprises a longitudinally oriented fastening bar 11, on which the fastening element 60 is displaceably seated. The fastening bar 11 is V-shaped in cross section and tapers in the direction toward the support 10. The fastening bar 11 is offset in respect to the wall element 30 in the direction of the interior of the rack frame. The rear support 20 also comprises a longitudinally oriented fastening bar 21, 22, on which the fastening elements 60 can be displaceably seated.

The fastening element 60 comprises two legs 63, 64 which are spaced apart parallel to each other and form a receptacle 65 between them so that the legs 63, 64 project beyond the fastening bar 11 on both sides. In accordance with this embodiment, the legs 63, 64 are of a form adapted to the V-shaped fastening bar 11 so that the V-shaped fastening bar 11 is positively overlapped. The two legs 63, 64 are aligned parallel to the wall element 30. The leg 63 facing the wall element 30 forms a screw receiver 62, which is disposed offset in respect to the fastening bar 11. A threaded receiver 61 is formed by leg 64 which faces away from the wall element 60 and has been aligned with the screw receiver 62. The wall element 30 is also provided with a screw receiver 32 which can be positioned over the screw receiver 62 of the leg 63 to coincide with it.

A fastening screw 70 is inserted into the screw receivers 32 and 62 from the outside of the rack frame and screwed together with the threaded receiver 61 of the leg 64. In the process, the two legs 63, 64 clamp the fastening bar 11 in the receptacle 65 so that the fastening element 60 as well as the wall element 30 are fixed in place on the front support 10. As shown in FIG. 1, this fastening mechanism is used in an analogous manner for the two rear supports 20.

The wall elements 30 comprise lateral vertical edges 31 which are inserted into elongated slots 13 of the supports 10, 20. A contact bar 12 adjoins the elongated slots 13 and is offset in respect to the profiled outside 14 of the supports 10, 20 toward the interior of the rack frame by an amount which corresponds to the thickness of the wall element 30. In this way, the beveled edges 31 of the wall element 30 can be inserted into the elongated slots 13. The insertion movement is limited by the contact bar 12 which comes into contact with the inside of the wall element 30. To seal the rack frame according to this invention against moisture, a sealing element 75 such as a packing cord of rubber can be positioned in elongated slot 13, or positioned on the vertical contact bar 12 and/or the inside of a wall element 30, 40 facing the vertical contact bar 12.

We claim:

1. In a rack frame comprising a plurality of vertical supports at least partially closed by at least one wall element, said at least one wall element embodied as a panel element fastenable by fastening means to respectively two adjoining said vertical supports, the improvement comprising:

the two adjoining said vertical supports (10, 20) each comprising a fastening bar (11, 21, 22) extending parallel to said at least one wall element (30, 40), on which at least one U-shaped fastening element (60) having two legs (63, 64) can be adjusted and fixed in place;

the two adjoining said vertical supports (10, 20) each forming an elongated slot (13);

said at least one wall element (30, 40) being securable to said adjoining said vertical supports with the fastening elements (60);

the at least one wall element (30, 40) having at least one beveled edge insertable into one of the elongated slots (13) of the adjoining said vertical supports (10, 20);

said two legs (63, 64) extending generally parallel with respect to the at least one wall element and each of said two legs projecting a distance beyond the fastening bar (11, 21, 22);

one of said two legs (63) facing said at least one wall element (30, 40) forming a screw receiver (62) and another of said two legs (64) facing away from said at least one wall element (30, 40) forming a threaded receiver (61) aligned with the screw receiver (62), and a fastening screw (70) positioned in said screw receiver (32, 62) and threadedly engaged with said threaded receiver (61).

2. The rack frame in accordance with claim 1, wherein each of said adjoining said vertical supports (10, 20) comprises a vertical contact bar (12) offset in respect to an outside of said adjoining said vertical supports (10, 20) in a direction toward an interior of said rack frame, the fastening bar (11, 21, 22) is offset in respect to the contact bar (12) in said direction toward said interior of said rack frame, and an inside of said at least one wall element (30, 40) is supported on said vertical contact bar (12).

3. The rack frame in accordance with claim 2, wherein said contact bar (12) of each of said adjoining vertical supports (10, 20) is offset in respect to an outside of said respective said adjoining vertical support (10, 20) by a thickness of said at least one wall element (30, 40).

4. The rack frame in accordance with claim 1, wherein each of said adjoining said vertical supports (10, 20) comprises a vertical contact bar (12) which adjoins an elongated slot (13) of said respective said vertical support (10, 20).

5. The rack frame in accordance with claim 1, wherein at least one sealing element (75) is inserted into an elongated slot (13) of said respective said vertical support (10,20).

6. The rack frame in accordance with claim 2, wherein a sealing element (75) is disposed on one of said vertical contact bar (12) and an inside of said at least one wall element (30, 40) facing said vertical contact bar (12).

7. The rack frame in accordance with claim 1, wherein the fastening bars (11, 21, 22) form an undercut and are disposed facing each other on a front said vertical support (10) and a rear said vertical support (20).

8. The rack frame in accordance with claim 1, wherein said two legs (63, 64) of the fastening element (60) extend parallel to said at least one wall element (30, 40) and are directed toward a front on a front said vertical support (10) and toward a back on a rear said vertical support (20).

9. The rack frame in accordance with claim 2, wherein the contact bar (12) adjoins an elongated slot (13) of said respective said vertical support (10, 20).

10. The rack frame in accordance with claim 4, wherein at least one sealing element (75) is inserted into an elongated slot (13) of said respective said vertical support (10, 20).

11. The rack frame in accordance with claim 9, wherein at least one sealing element (75) is inserted into said elongated slot (13) of said respective said vertical support (10, 20).

12. The rack frame in accordance with claim 9, wherein a sealing element (75) is disposed on one of said vertical contact bar (12) and an inside of said at least one wall element (30, 40) facing said vertical contact bar (12).

13. The rack frame in accordance with claim 12, wherein the fastening bars (11, 21, 22) form an undercut and are disposed facing each other on a front said vertical support (10) and a rear said vertical support (20).

* * * * *